(12) United States Patent
Kaneko

(10) Patent No.: US 8,017,996 B2
(45) Date of Patent: Sep. 13, 2011

(54) SEMICONDUCTOR DEVICE, AND ENERGY TRANSMISSION DEVICE USING THE SAME

(75) Inventor: Saichirou Kaneko, Kyoto (JP)

(73) Assignee: Panasonic Corporation, Osaka (JP)

( * ) Notice: Subject to any disclaimer, the term of this patent is extended or adjusted under 35 U.S.C. 154(b) by 383 days.

(21) Appl. No.: 12/421,125

(22) Filed: Apr. 9, 2009

(65) Prior Publication Data

US 2009/0257249 A1    Oct. 15, 2009

(30) Foreign Application Priority Data

Apr. 15, 2008   (JP) .................................. 2008-105998

(51) Int. Cl.
*H01L 29/76* (2006.01)
*H02M 3/18* (2006.01)
(52) U.S. Cl. ..................................... 257/339; 363/56.01
(58) Field of Classification Search .................... 363/16, 363/20, 21.01, 56.01, 97, 131, 147; 257/327, 257/335–339
See application file for complete search history.

(56) References Cited

U.S. PATENT DOCUMENTS

| | | | |
|---|---|---|---|
| 4,811,075 A | 3/1989 | Eklund | |
| 5,285,369 A | 2/1994 | Balakrishnan | |
| 5,432,370 A | 7/1995 | Kitamura et al. | |
| 5,592,014 A | 1/1997 | Funaki et al. | |
| 5,894,164 A | 4/1999 | Funaki et al. | |
| 5,900,665 A * | 5/1999 | Tobita | 257/357 |
| 6,014,322 A * | 1/2000 | Higashi et al. | 363/65 |
| 6,242,787 B1 | 6/2001 | Nakayama et al. | |
| 6,424,187 B1 * | 7/2002 | Takahashi et al. | 327/110 |
| 2001/0025961 A1 | 10/2001 | Nakamura et al. | |
| 2003/0048644 A1 * | 3/2003 | Nagai et al. | 363/21.09 |
| 2004/0240233 A1 | 12/2004 | Disney | |

FOREIGN PATENT DOCUMENTS

JP          09-266256          10/1997

* cited by examiner

*Primary Examiner* — Matthew Nguyen
(74) *Attorney, Agent, or Firm* — McDermott Will & Emery LLP

(57) ABSTRACT

An energy transmission device includes: a semiconductor device formed on a first semiconductor substrate; a semiconductor integrated circuit including a reverse current preventing diode and a control circuit; a DC voltage source; and a transformer. The reverse current preventing diode includes a reverse current preventing layer of a second conductivity type formed at a surface of a second semiconductor substrate, and a well layer of a first conductivity type formed in the second semiconductor substrate and covering the reverse current preventing layer. The transformer includes a primary winding connected in series with the semiconductor device and the DC voltage source, and a first secondary winding connected to a load. The energy transmission device is configured so that electric power is supplied from the first secondary winding of the transformer to the load. A second drain electrode of the semiconductor device is electrically connected to the reverse current preventing layer.

13 Claims, 7 Drawing Sheets

SEMICONDUCTOR DEVICE, AND ENERGY TRANSMISSION DEVICE USING THE SAME

CROSS-REFERENCE TO RELATED APPLICATIONS

This application claims priority under 35 U.S.C. §119(a) based on Japanese Patent Application No. 2008-105998 filed on Apr. 15, 2008, the entire contents of which are hereby incorporated by reference.

BACKGROUND

The present invention relates to a semiconductor device, and an energy transmission device using the semiconductor device. More particularly, the present invention relates to a semiconductor device for repeatedly conducting and blocking a main current in a switching power supply unit such as an energy transmission device.

A conventional semiconductor device will now be described with reference to FIG. 6 (see, e.g., Patent Document 1: U.S. Pat. No. 4,811,075). A high breakdown voltage lateral semiconductor device is herein described as a specific example of the conventional semiconductor device. FIG. 6 is a cross-sectional view showing the structure of a conventional semiconductor device.

As shown in FIG. 6, a conventional semiconductor device 124 includes a high breakdown voltage semiconductor element 123 including a switching element 121 and a JFET (Junction Field-Effect Transistor) element 122. The semiconductor device 124 includes the following four types of electrodes: a source electrode 111; a gate electrode 112; a first drain electrode (hereinafter, referred to as "drain electrode") 113; and a second drain electrode (hereinafter, referred to as "TAP electrode") 114.

An N-type drift region 102 is formed at the surface of a P⁻-type semiconductor substrate 101. A P-type base region 103 is formed adjacent to the drift region 102 at the surface of the semiconductor substrate 101. An N⁺-type source region 104 is formed spaced apart from the drift region 102 at the surface of the base region 103. A P⁺-type base contact region 105 is formed adjacent to the source region 104 at the surface of the base region 103. A gate insulating film 106 is formed on the base region 103 between the source region 104 and the drift region 102. An N⁺-type first drain region 107 is formed spaced apart from the base region 103 at the surface of the drift region 102. An N⁺-type second drain region 108 is formed spaced apart from the first drain region 107 at the surface of the drift region 102.

A P-type first top semiconductor layer 109a is formed spaced apart from the first drain region 107 at the surface of the drift region 102 between the base region 103 and the first drain region 107. The first top semiconductor layer 109a is electrically connected to the base region 103 at a position not shown in the figure. A P-type second top semiconductor layer 109b is formed spaced apart from the first drain region 107 and the second drain region 108 at the surface of the drift region 102 between the first drain region 107 and the second drain region 108. The second top semiconductor layer 109b is electrically connected to the base region 103 at a position not shown in the figure.

The source electrode 111 is formed over the semiconductor substrate 101, and is electrically connected to the base region 103 and the source region 104. The gate electrode 112 is formed on the gate insulating film 106. The drain electrode 113 is formed over the semiconductor substrate 101, and is electrically connected to the first drain region 107. The TAP electrode 114 is formed over the semiconductor substrate 101, and is electrically connected to the second drain region 108.

First and second field insulating films 110a, 110b are formed on the first and second top semiconductor layers 109a, 109b, respectively. An interlayer film 115 is formed over the semiconductor substrate 101 with the first and second field insulating films 110a, 110b interposed therebetween.

When a voltage is applied between the drain electrode 113 and the source electrode 111 of the conventional semiconductor device, the drift region 102 near the second drain region 108 is depleted due to field effects. A voltage which is output to the TAP electrode 114 is therefore pinched off when it reaches, for example, about 50 V.

More specifically, as shown in FIG. 7, when a voltage lower than the pinch-off voltage is applied between the drain electrode 113 and the source electrode 111, a voltage which is supplied to the TAP electrode 114 is proportional to the voltage applied between the drain electrode 113 and the source electrode 111. When a voltage higher than the pinch-off voltage is applied between the drain electrode 113 and the source electrode 111, on the other hand, a voltage which is supplied to the TAP electrode 114 is equal to the pinch-off voltage. In other words, the voltage which is supplied to the TAP electrode 114 has a fixed value, and is lower than the voltage applied between the drain electrode 113 and the source electrode 111.

As described above, in the conventional semiconductor device 124, the voltage which is supplied to the TAP electrode 114 in an on state is proportional to the voltage of the drain electrode 113, as shown in FIG. 7. An on-state voltage between the drain electrode 113 and the source electrode 111 in an on state can be detected by the TAP electrode 114.

Even if a high voltage is applied to the drain electrode 113 in an off state, a voltage which is output to the TAP electrode 114 can be pinched off.

Operation of the conventional semiconductor device 124 will now be described.

When the source electrode 111 has a negative voltage and the gate electrode 112 has a positive voltage, the surface of a region which faces the gate electrode 112 with the gate insulating film 106 interposed therebetween in the base region 103 is reversed to an N-type region. A current can therefore be supplied between the drain electrode 113 and the source electrode 111 through the N-type region (on state). In other words, a current flowing between the drain electrode 113 and the source electrode 111 can be controlled by an electric field which is generated by applying a voltage to the gate electrode 112.

Even when the gate electrode 112 has the same potential as that of the source electrode 111 (off state) and a high voltage is applied to the drain electrode 113, a voltage which is output to the TAP electrode 114 can be pinched off by a depletion layer which spreads in the drift region 102 near the second drain region 108. The TAP electrode 114 can therefore be connected to a low voltage circuit (a specific example of the "low voltage circuit" is a control circuit (for example, see 144 in FIG. 8 described below) which is included in a switching power supply unit having the conventional semiconductor device.

Hereinafter, an energy transmission device using the conventional semiconductor device will be described with reference to FIG. 8 (see, for example, Patent Document 2: U.S. Pat. No. 5,285,369). A switching power supply unit is herein described as a specific example of the energy transmission device. FIG. 8 is a circuit diagram of a switching power supply unit including the conventional semiconductor device 124.

As shown in FIG. 8, the conventional switching power supply unit includes the conventional semiconductor device 124, a semiconductor integrated circuit 148, a direct current (DC) voltage source 152, and a transformer 160. The transformer 160 includes a primary winding 153, a first secondary winding 154, and a second secondary winding 157. The primary winding 153 is connected in series with the semiconductor device 124 and the DC voltage source 152. The first secondary winding 154 is connected to a load, and the second secondary winding 157 is connected to a control circuit 144. The conventional semiconductor device 124 is configured so that electric power is supplied from the first secondary winding 154 of the transformer 160 to the load, and electric power is supplied from the second secondary winding 157 of the transformer 160 to the control circuit 144.

Respective structures of the semiconductor integrated circuit 148, the DC voltage source 152, and the transformer 160 will be described below.

The semiconductor integrated circuit 148 includes the control circuit 144 and a medium breakdown voltage transistor 142 having a breakdown voltage of, for example, 100 V. The control circuit 144 uses, for example, pulse width modulation or the like to control switching of the semiconductor device 124 which switches a main current between a flowing state and a non-flowing state.

The DC voltage source 152 is formed by a diode bridge 150 and a filter capacitor 151. An alternating current (AC) power source e is supplied to the DC voltage source 152.

The transformer 160 includes the primary winding 153, the first secondary winding 154, and the second secondary winding 157. The first secondary winding 154 of the transformer 160 is connected to a diode 155 and a filter capacitor 156. The second secondary winding 157 of the transformer 160 is connected to a diode 158 and a filter capacitor 159.

Note that the semiconductor integrated circuit 148 is connected to the semiconductor device 124 through a gate electrode and a TAP electrode. The semiconductor integrated circuit 148 and the semiconductor device 124 are formed on separate semiconductor substrates.

The control circuit 144 is a low voltage circuit, and a high voltage cannot be applied to the control circuit 144. As shown in FIG. 8, the TAP electrode of a JFET element 122 and the control circuit 144 are therefore connected to each other through, for example, a resistor 143 and the medium breakdown voltage transistor 142.

The voltage of the TAP electrode is pinched off, as described above. Therefore, even if a high voltage is applied from the primary winding 153 of the transformer 160 to the drain electrode, the TAP electrode has a fixed voltage, that is, a pinch-off voltage (e.g., about 50 V). The TAP electrode can be connected to the control circuit 144, and starting electric power can be supplied to the control circuit 144.

Operation of supplying the starting electric power from the TAP electrode to the control circuit 144 upon starting (upon power-on) will now be described.

During normal operation, a voltage is induced in the second secondary winding 157 of the transformer 160 by repeated switching operation of the switching element 121. As a result, a current flows through the diode 158 and is supplied from a Vbias power supply terminal 149 to the control circuit 144. When the AC power source e is supplied, on the other hand, the switching element 121 has not been performing the switching operation. No voltage has therefore been induced in the second secondary winding 157, and no power source has been supplied to the control circuit 144.

The medium breakdown voltage transistor 142 is controlled by the control circuit 144 so as to be turned on when the voltage of the Vbias power supply terminal 149 has a predetermined value or less. Accordingly, after the AC power source e is supplied, a direct current which has generated in the DC voltage source 152 and has flown through the primary winding 153 is partially supplied from the TAP electrode of the JFET element 122 to the control circuit 144 through the medium breakdown voltage transistor 142 in an on state, whereby the control circuit 144 is started.

The switching element 121 then repeats the switching operation. As a result, a voltage is induced in the second secondary winding 157 of the transformer 160, and a current flows through the diode 158 and is supplied from the Vbias power supply terminal 149 to the control circuit 144. When the voltage of the Vbias power supply terminal 149 exceeds the predetermined value, the medium breakdown voltage transistor 142 is turned off, and the control circuit 144 operates in a steady state.

Since a low starting voltage which is required upon power-on can thus be generated by the TAP electrode, it is not necessary to provide a high breakdown voltage, high power resistor to supply electric power. As a result, interconnection is simplified, and reduction in cost and reduction in size of a power supply circuit can be achieved accordingly.

SUMMARY

However, the energy transmission device using the conventional semiconductor device has problems.

The problems of the energy transmission device will now be described with reference to FIG. 9. A switching power supply unit is herein described as a specific example of the energy transmission device. FIG. 9 is a cross-sectional view showing respective structures of a conventional semiconductor device 124 and a semiconductor integrated circuit 148 which are included in the conventional switching power supply unit. Note that, since the semiconductor device 124 in FIG. 9 has the same structure as that of the semiconductor device 124 in FIG. 6, description thereof will be omitted. A medium breakdown voltage transistor 142 in FIG. 9 corresponds to the medium breakdown voltage transistor 142 in FIG. 8. A bipolar transistor 168 in FIG. 9 is included in a control circuit (see 144 in FIG. 8). Note that, for simplification of illustration, the bipolar transistor 168 in FIG. 9 is not shown in FIG. 8.

As shown in FIG. 9, the medium breakdown voltage transistor 142 and the bipolar transistor 168 are formed on a common P⁻-type second semiconductor substrate 125. The second semiconductor substrate 125 is formed separately from a first semiconductor substrate 101 of the semiconductor device 124.

Respective structures of the medium breakdown voltage transistor 142 and the bipolar transistor 168 will be described below.

[Medium Breakdown Voltage Transistor]

As shown in FIG. 9, the medium breakdown voltage transistor 142 includes an N-type drift region 131, a P-type base region 132, an N⁺-type source region 133, a gate insulating film 134, an N⁺-type drain region 135, a source electrode 136, a gate electrode 137, and a drain electrode 138. The N-type drift region 131 is formed at the surface of the second semiconductor substrate 125. The P-type base region 132 is formed adjacent to the drift region 131 at the surface of the second semiconductor substrate 125. The N⁺-type source region 133 is formed at the surface of the base region 132. The gate insulating film 134 is formed on the base region 132. The N+-type drain region 135 is formed spaced apart from the base region 132 at the surface of the drift region 131. The source electrode 136 is formed over the second semiconductor substrate 125 and is electrically connected to the source region 133. The gate electrode 137 is formed on the gate insulating film 134. The drain electrode 138 is formed over the second semiconductor substrate 125 and is electrically connected to the drain region 135.

The source electrode 136 is connected to the control circuit (see 144 in FIG. 8) at a position not shown in the figure. The gate electrode 137 is connected to the TAP electrode 114 through the resistor (see 143 in FIG. 8) at a position not shown in the figure. The gate electrode 137 is also connected to the control circuit at a position not shown in the figure.

As shown in FIG. 9, the TAP electrode 114 of the semiconductor device 124 is connected to the drain electrode 138 of the medium breakdown voltage transistor 142.

[Bipolar Transistor]

The bipolar transistor 168 includes an N-type collector region 161, an N+-type collector contact region 162, a P-type base region 163, an N+-type emitter region 164, a collector electrode 165, a base electrode 166, and an emitter electrode 167. The N-type collector region 161 is formed at the surface of the second semiconductor substrate 125. The N+-type collector contact region 162 is formed at the surface of the collector region 161. The P-type base region 163 is formed spaced apart from the collector contact region 162 at the surface of the collector region 161. The N+-type emitter region 164 is formed at the surface of the base region 163. The collector electrode 165 is formed over the second semiconductor substrate 125, and is electrically connected to the collector contact region 162. The base electrode 166 is formed over the second semiconductor substrate 125, and is electrically connected to the base region 163. The emitter electrode 167 is formed over the second semiconductor substrate 125, and is electrically connected to the emitter region 164.

The bipolar transistor 168 and the medium breakdown voltage transistor 142 are thus formed on the common second semiconductor substrate 125, and an interlayer film 140 is formed over the second semiconductor substrate 125 with a field insulating film 139 interposed therebetween.

When the drain electrode 113 is negatively biased with respect to the source electrode 111, a negative voltage is output from the TAP electrode 114. As a result, the N+-drain region 135 is forward biased with respect to the P−-type second semiconductor substrate 125, and a current flows from the second semiconductor substrate 125 to the drain region 135. At this time, a parasitic thyristor formed by the P-type base region 163, the N-type collector region 161, the P−-type second semiconductor substrate 125, and the N-type drift region 131 is turned on. In other words, latch-up occurs in the semiconductor integrated circuit 148, causing malfunction or breakdown.

As described above, in the conventional semiconductor device 124, latch-up occurs in the semiconductor integrated circuit 148 included in the switching power supply unit using the conventional semiconductor device 124, when the drain electrode 113 is negatively biased with respect to the source electrode 111. The conventional semiconductor device 124 therefore has a problem that the drain electrode 113 cannot be negatively biased with respect to the source electrode 111.

Moreover, the conventional switching power supply unit has a problem that latch-up occurs in the semiconductor integrated circuit 148 when the drain electrode 113 is negatively biased with respect to the source electrode 111 (for example, when a negative bias is momentarily applied to the drain electrode 113 due to electromagnetic noise or a lightning surge). The conventional switching power supply unit therefore has poor noise immunity and poor lightning-surge immunity. In addition, the transformer needs to be designed so that the drain electrode 113 is not negatively biased, which complicates design of peripheral parts including the transformer.

In view of the above, it is an object of the present invention to provide an energy transmission device capable of preventing latch-up from occurring in a semiconductor integrated circuit even when a drain electrode is negatively biased with respect to a source electrode, and to provide a semiconductor device capable of implementing such an energy transmission device.

In order to achieve the above object, a semiconductor device according to an aspect of the present invention is a semiconductor device which includes a high breakdown voltage semiconductor element including a switching element and a JFET element. The high breakdown voltage semiconductor element includes a drift region of a first conductivity type formed at a surface of a first semiconductor substrate, a base region of a second conductivity type formed adjacent to the drift region at the surface of the first semiconductor substrate, a source region of a first conductivity type formed spaced apart from the drift region at a surface of the base region, a gate insulating film formed on the base region between the source region and the drift region, a region (e.g., a first drain region of a first conductivity type) formed spaced apart from the base region at a surface of the drift region, a second drain region of a first conductivity type formed spaced apart from the region (e.g., the first drain region) at the surface of the drift region, a source electrode formed over the first semiconductor substrate and electrically connected to the base region and the source region, a gate electrode formed on the gate insulating film, an electrode (e.g., a first drain electrode) formed over the first semiconductor substrate and electrically connected to the region (e.g., the first drain region), and a second drain electrode formed over the first semiconductor substrate and electrically connected to the second drain region. The second drain electrode is electrically connected to a reverse current preventing layer of a second conductivity type formed at a surface of a second semiconductor substrate. The reverse current preventing layer is covered by a well layer of a first conductivity type formed in the second semiconductor substrate.

According to the semiconductor device of the above aspect of the present invention, even if the first drain electrode is negatively biased with respect to the source electrode, a negative voltage which is output from the second drain electrode (TAP electrode) reverse biases the reverse current preventing layer and the well layer. Accordingly, no current flows into the reverse current preventing layer. The first drain electrode can thus be negatively biased with respect to the source electrode.

When the semiconductor device of the above aspect of the present invention is applied to an energy transmission device, latch-up can be prevented from occurring in a semiconductor integrated circuit included in the energy transmission device. The present invention can thus provide an energy transmission device having higher noise immunity and higher lightning surge immunity than those of energy transmission devices using the conventional semiconductor device. Moreover, in the energy transmission device using the semiconductor device of the above aspect of the present invention, it is not necessary to design a transformer so that the first drain electrode is not negatively biased. As a result, design of peripheral parts can be simplified.

Moreover, even if a high voltage is applied to the first drain electrode, a voltage which is output to the second drain electrode (TAP electrode) can be pinched off by a depletion layer which spreads in the drift region near the second drain region.

In the semiconductor device of the above aspect of the present invention, it is preferable that the first semiconductor substrate and the second semiconductor substrate are formed separately.

In the semiconductor device of the above aspect of the present invention, it is preferable that the first semiconductor substrate and the second semiconductor substrate are formed as a common substrate.

In the semiconductor device of the above aspect of the present invention, it is preferable that the high breakdown voltage semiconductor element further includes a first top semiconductor layer of a second conductivity type which is formed spaced apart from the first drain region at the surface of the drift region between the base region and the first drain region, and which is electrically connected to the base region.

In the high breakdown voltage semiconductor element including the first top semiconductor layer, the concentration in the drift region can be made higher than that in the drift region of, for example, the high breakdown voltage semiconductor element which does not include the first top semiconductor layer. As a result, the on-state resistance of the semiconductor device can be reduced.

In the semiconductor device of the above aspect of the present invention, it is preferable that a conductivity type of the first semiconductor substrate is a second conductivity type, and the high breakdown voltage semiconductor element further includes a first inner semiconductor layer of a second conductivity type which is formed spaced apart from the first drain region in the drift region between the base region and the first drain region, and which is electrically connected to the base region.

In the high breakdown voltage semiconductor element including the first inner semiconductor layer, the concentration in the drift region can be made higher than that in the drift region of, for example, the high breakdown voltage semiconductor element including the first top semiconductor layer. As a result, the on-state resistance of the semiconductor device can be reduced.

In the semiconductor device of the above aspect of the present invention, it is preferable that the region is a collector region of a second conductivity type, the electrode is a collector electrode, and the collector electrode is electrically connected to the collector region.

An IGBT (Insulated Gate Bipolar Transistor) type semiconductor device can thus be provided. Since an IGBT bipolar element is used instead of a MOS (Metal Oxide Semiconductor) unipolar element as the switching element, the on-state resistance of the semiconductor device can be reduced.

In the semiconductor device of the above aspect of the present invention, it is preferable that the region includes a collector region of a second conductivity type and a first drain region of a first conductivity type adjacent to the collector region, the electrode is a collector/drain electrode, and the collector/drain electrode is electrically connected to the collector region and the first drain region.

In this case, since electrons can be extracted from the first drain region upon turn-off, the switching speed can be increased as compared to, for example, the IGBT-type semiconductor device.

In order to achieve the above object of the present invention, an energy transmission device according to another aspect of the present invention includes: the semiconductor device of the above aspect of the present invention; a semiconductor integrated circuit including a reverse current preventing diode including the reverse current preventing layer and the well layer, and a control circuit for controlling switching of the semiconductor device which repeatedly conducts and blocks a main current; a DC voltage source; and a transformer. The transformer includes a primary winding connected in series with the semiconductor device and the DC voltage source, and a first secondary winding connected to a load. The energy transmission device is configured so that electric power is supplied from the first secondary winding of the transformer to the load. The second drain electrode of the semiconductor device is electrically connected to the reverse current preventing layer of the semiconductor integrated circuit.

According to the energy transmission device of the above aspect of the present invention, even if the first drain electrode is negatively biased with respect to the source electrode, a negative voltage which is output from the second drain electrode (TAP electrode) reverse biases the reverse current preventing layer and the well layer. Accordingly, no current flows into the reverse current preventing layer, whereby latch-up in the semiconductor integrated circuit can be prevented. The present invention can thus implement an energy transmission device having higher noise immunity and higher lightning surge immunity than those of conventional energy transmission devices. Moreover, it is not necessary to design the transformer so that the first drain electrode is not negatively biased. As a result, design of peripheral parts can be simplified.

In the energy transmission device of the above aspect of the present invention, it is preferable that the transformer further includes a second secondary winding connected to the control circuit, and the energy transmission device is configured so that electric power is supplied from the second secondary winding of the transformer to the control circuit.

In the energy transmission device of the above aspect of the present invention, it is preferable that the reverse current preventing diode further includes a cathode contact region of a first conductivity type formed spaced apart from the reverse current preventing layer at a surface of the well layer, an anode electrode formed over the second semiconductor substrate and electrically connected to the reverse current preventing layer, and a cathode electrode formed over the second semiconductor substrate and electrically connected to the cathode contact region. It is also preferable that the anode electrode is connected to the second drain electrode of the semiconductor device.

In the energy transmission device of the above aspect of the present invention, it is preferable that the semiconductor integrated circuit further includes a first transistor of a first conductivity type, the first transistor is connected to the second drain electrode of the semiconductor device through a first resistor and the reverse current preventing diode, the first transistor is connected to a ground potential through a second resistor, and a gate potential of the first transistor is synchronized with a gate potential of the switching element.

In this case, by voltage division by the first resistor and the second resistor, an on-state voltage which is output to the second drain electrode (TAP electrode) upon turn-on of the switching element (i.e., an on-state voltage which is output to the first drain electrode) can be detected. A current flowing in the semiconductor device can be controlled by detecting the on-state voltage which is output to the second drain electrode (TAP electrode).

In the energy transmission device of the above aspect of the present invention, it is preferable that the semiconductor integrated circuit further includes a second transistor of a first conductivity type, the second drain electrode of the semiconductor device and the control circuit are connected to each other through a resistor and the second transistor, and the second transistor is controlled by the control circuit so as to be turned on when a voltage of a bias power supply terminal for supplying a current to the control circuit has a predetermined value or less.

In this case, driving electric power can be supplied from the second drain electrode (TAP electrode) to the control circuit upon starting. Since a low starting voltage which is required upon power-on can be generated by the second drain electrode, it is not necessary to provide a high breakdown voltage, high power resistor to supply electric power. As a result, interconnection is simplified, and reduction in cost and reduction in size of a power supply circuit can be achieved accordingly.

As described above, according to the semiconductor device of the above aspect of the present invention and the energy transmission device using this semiconductor device, a negative voltage which is output from the second drain electrode (TAP electrode) reverse biases the reverse current preventing layer and the well layer even if the first drain electrode is negatively biased with respect to the source electrode. Accordingly, no current flows into the reverse current preventing layer, and latch-up in the semiconductor integrated circuit can be prevented.

DETAILED DESCRIPTION

Hereinafter, embodiments of the present invention will be described with reference to the accompanying drawings.

First Embodiment

Figure 1:
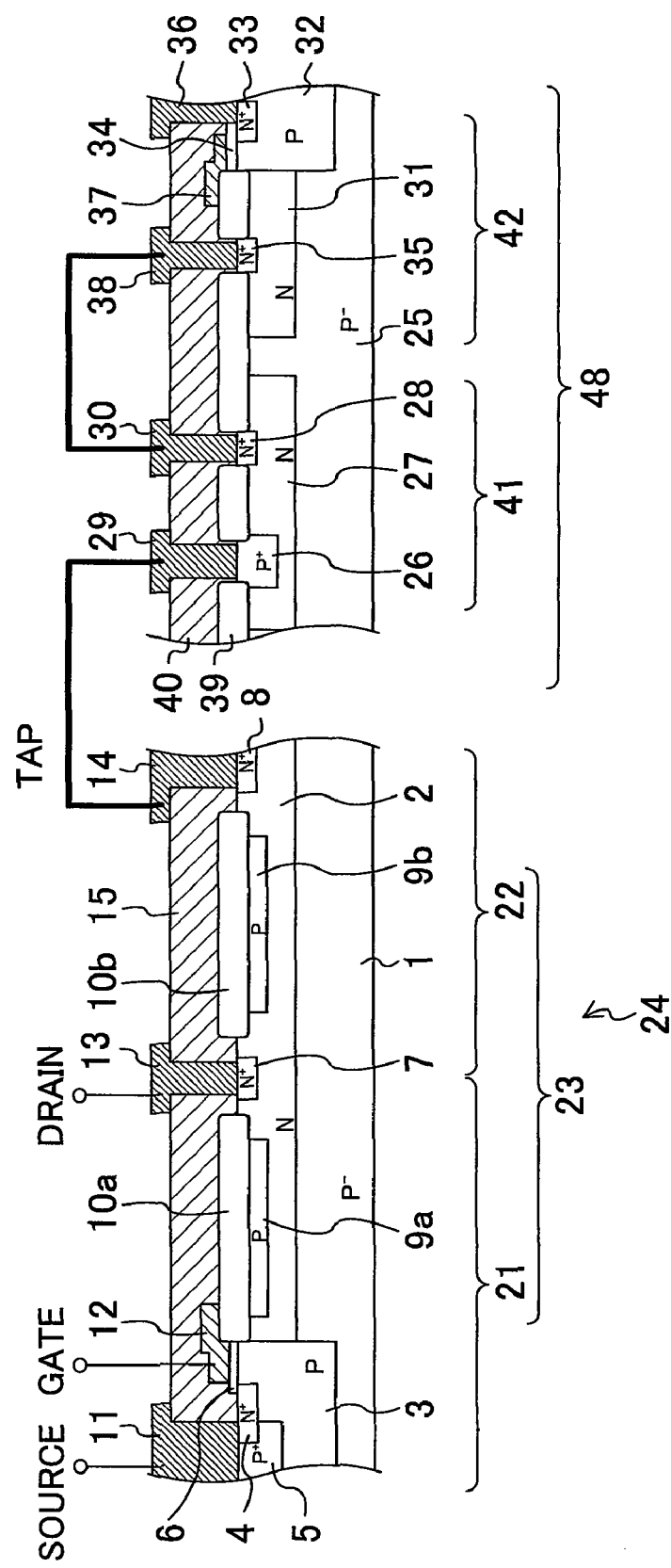
FIG. 1 is a cross-sectional view showing a structure of a semiconductor device according to a first embodiment of the present invention.

A structure of a semiconductor device according to a first embodiment of the present invention will be described with reference to FIG. 1. FIG. 1 is a cross-sectional view showing the structure of the semiconductor device according to the first embodiment of the present invention. Note that, in addition to a semiconductor device 24, FIG. 1 shows a semiconductor integrated circuit 48 which is included in a switching power supply unit using the semiconductor device 24.

[Semiconductor Device]

The semiconductor device 24 of the first embodiment includes a high breakdown voltage semiconductor element 23 including a switching element 21 and a JFET element 22, as in conventional examples.

The semiconductor device 24 includes the following four kinds of electrodes: a source electrode 11; a gate electrode 12; a first drain electrode (hereinafter, referred to as "drain electrode") 13; and a second drain electrode (hereinafter, referred to as "TAP electrode") 14.

The structure of the high breakdown voltage semiconductor element 23 will now be described.

In the high breakdown voltage semiconductor element 23, an N-type drift region 2 is formed at the surface of a P$^-$-type first semiconductor substrate 1. A P-type base region 3 is formed adjacent to the drift region 2 at the surface of the first semiconductor substrate 1. An N$^+$-type source region 4 is formed spaced apart from the drift region 2 at the surface of the base region 3. A P$^+$-type base contact region 5 is formed adjacent to the source region 4 at the surface of the base region 3. A gate insulating film 6 is formed on the base region 3 between the source region 4 and the drift region 2. An N$^+$-type first drain region 7 is formed spaced apart from the base region 3 at the surface of the drift region 2. An N$^+$-type second drain region 8 is formed spaced apart from the first drain region 7 at the surface of the drift region 2.

A P-type first top semiconductor layer 9a is formed spaced apart from the first drain region 7 at the surface of the drift region 2 between the base region 3 and the first drain region 7. The first top semiconductor layer 9a is electrically connected to the base region 3 at a position not shown in the figure. A P-type second top semiconductor layer 9b is formed spaced apart from the first drain region 7 and the second drain region 8 at the surface of the drift region 2 between the first drain region 7 and the second drain region 8. The second top semiconductor layer 9b is electrically connected to the base region 3 at a position not shown in the figure. First and second field insulating films 10a, 10b are formed on the first and second top semiconductor layers 9a, 9b, respectively.

The source electrode 11 is formed over the first semiconductor substrate 1, and is electrically connected to the base region 3 and the source region 4. The gate electrode 12 is formed on the gate insulating film 6. The drain electrode 13 is formed over the semiconductor substrate 1, and is electrically connected to the first drain region 7. The TAP electrode 14 is formed over the semiconductor substrate 1, and is electrically connected to the second drain region 8.

An interlayer film 15 is formed over the first semiconductor substrate 1 with the first and second field insulating films 10a, 10b interposed therebetween.

Figure 9:
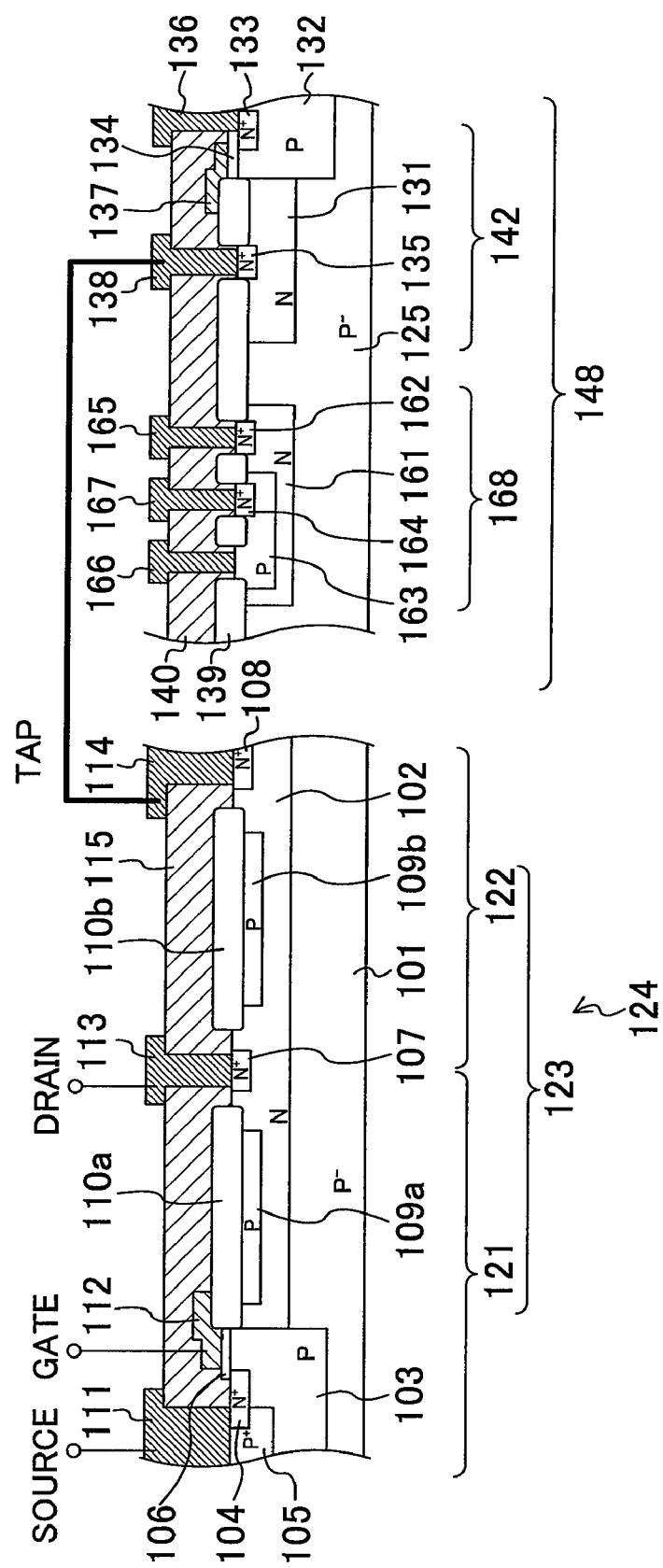
FIG. 9 is a cross-sectional view showing a structure of a conventional semiconductor device and a conventional semiconductor integrated circuit.

The semiconductor device 24 of the first embodiment is different from the conventional semiconductor device (see 124 in FIG. 9) in that the TAP electrode 14 is not electrically connected to the drain region (see 135 in FIG. 9) but to a P$^+$-type reverse current preventing layer 26. The reverse current preventing layer 26 is formed at the surface of a second semiconductor substrate 25 which is formed separately from the first semiconductor substrate 1. The reverse current preventing layer 26 is covered by an N-type well layer 27 formed in the second semiconductor substrate 25.

The semiconductor device 24 of the first embodiment provides the following unique effects.

Even if the drain electrode 13 is negatively biased with respect to the source electrode 11, a negative voltage which is output from the TAP electrode 14 reversely biases the reverse current preventing layer 26 and the well layer 27. Therefore, no current flows into the reverse current preventing layer 26. The drain electrode 13 can therefore be negatively biased with respect to the source electrode 11.

Accordingly, when the semiconductor device 24 of the present embodiment is applied to, for example, a switching power supply unit, latch-up can be prevented from occurring in the semiconductor integrated circuit 48 included in the switching power supply unit. The present invention can thus provide a switching power supply unit having higher noise immunity and higher lightning surge immunity as compared to the switching power supply unit using the conventional semiconductor device. In addition, in the switching power supply unit using the semiconductor device 24 of the present embodiment, it is not necessary to design a transformer so that the drain electrode 13 is not negatively biased. As a result, design of peripheral parts can be simplified.

Moreover, the semiconductor device 24 of the present embodiment and the semiconductor integrated circuit 48 which is included in the switching power supply unit using the semiconductor device 24 are formed on separate semiconductor substrates. Latch-up in the semiconductor integrated circuit 48 can therefore be effectively prevented.

Moreover, the semiconductor device 24 of the present embodiment provides the similar effects as those of the conventional semiconductor device. That is, an on-state voltage between the drain electrode 13 and the source electrode 11 in an on state can be detected by the TAP electrode 14.

As shown in FIG. 1, the semiconductor device 24 of the present embodiment is electrically connected to the reverse current preventing layer 26 of a reverse current preventing diode 41 included in the semiconductor integrated circuit 48 (note that, as shown in FIG. 1, the semiconductor integrated circuit 48 includes, for example, a second transistor 42 and the like in addition to the reverse current preventing diode 41).

Figure 2:
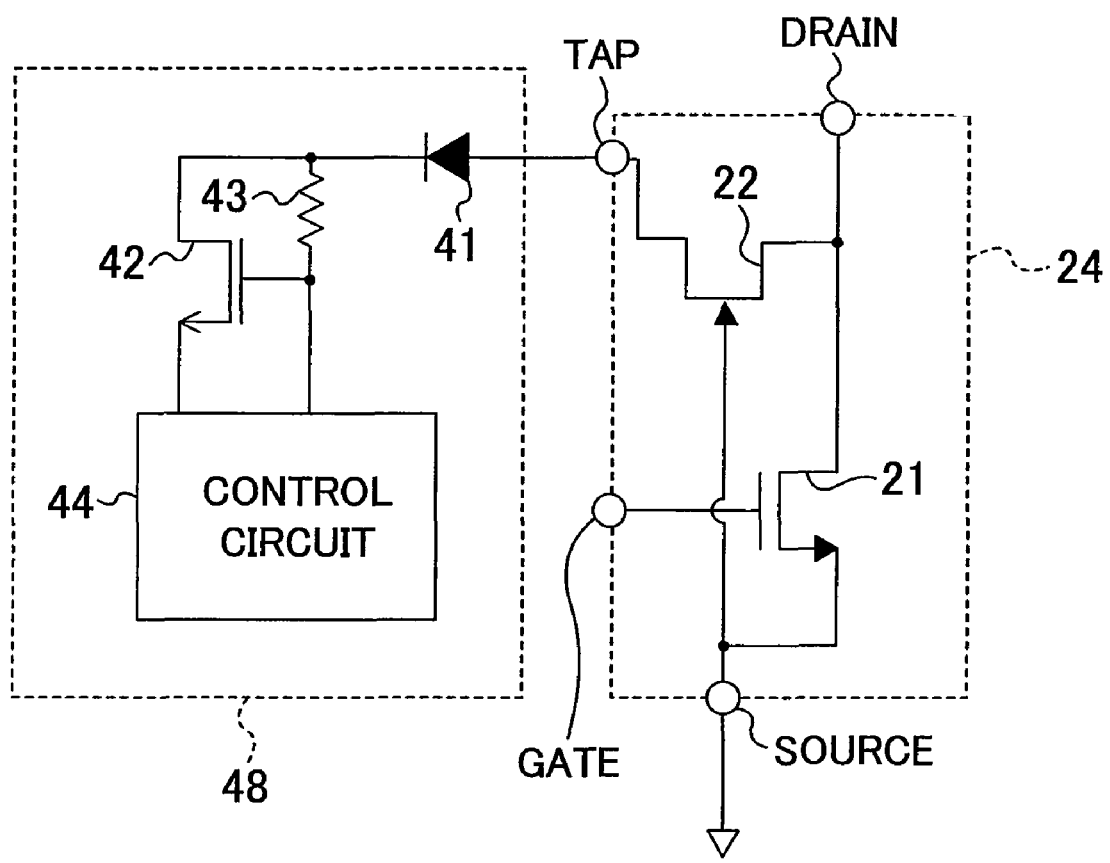
FIG. 2 is a circuit diagram of the semiconductor device and a semiconductor integrated circuit according to the first embodiment.

Hereinafter, the reverse current preventing diode 41 will be described with reference to FIGS. 1 and 2. FIG. 2 is a circuit diagram of the semiconductor device 24 and the semiconductor integrated circuit 48 according to the present embodiment (that is, a circuit diagram of the structure shown in FIG. 1). Note that, for simplification of illustration, the control circuit 44 included in the semiconductor integrated circuit 48 is not shown in FIG. 1.

As shown in FIG. 2, the TAP electrode 14 of the semiconductor device 24 is electrically connected to the reverse current preventing diode 41 included in the semiconductor integrated circuit 48.

The structure of the reverse current preventing diode 41 will now be described with reference to FIG. 1.

As shown in FIG. 1, the reverse current preventing diode 41 includes the P$^+$-type reverse current preventing layer 26 formed at the surface of the P$^-$-type second semiconductor substrate 25, and the N-type well layer 27 formed in the second semiconductor substrate 25 and covering the reverse current preventing layer 26.

The reverse current preventing diode 41 includes an N$^+$-type cathode contact region 28, an anode electrode 29, and a cathode electrode 30. The N$^+$-type cathode contact region 28 is formed spaced apart from the reverse current preventing layer 26 at the surface of the well layer 27. The anode electrode 29 is formed over the second semiconductor substrate 25, and is electrically connected to the reverse current preventing layer 26. The cathode electrode 30 is formed over the second semiconductor substrate 25, and is electrically connected to the cathode contact region 28.

As shown in FIG. 1, the cathode electrode 30 is connected to a drain electrode 38 of the N-type second transistor 42 having a breakdown voltage of, for example, 100 V.

Note that the second transistor 42 is structured as follows: as shown in FIG. 1, an N-type drift region 31 is formed at the surface of the second semiconductor substrate 25. A P-type base region 32 is formed adjacent to the drift region 31 at the surface of the second semiconductor substrate 25. An N$^+$-type source region 33 is formed spaced apart from the drift region 31 at the surface of the base region 32. A gate insulating film 34 is formed on the base region 32. An N$^+$-type drain region 35 is formed spaced apart from the base region 32 at the surface of the drift region 31. A source electrode 36 is formed over the second semiconductor substrate 25. The source electrode 36 is electrically connected to the source region 33. A gate electrode 37 is formed on the gate insulating film 34. A drain electrode 38 is formed over the second semiconductor substrate 25. The drain electrode 38 is electrically connected to the drain region 35.

Note that the source electrode 36 of the second transistor 42 is connected to the control circuit (see 44 in FIG. 2) at a position not shown in the figure. The gate electrode 37 of the second transistor 42 is connected to the cathode electrode 30 through a resistor (see 43 in FIG. 2) at a position not shown in the figure. The gate electrode 37 is further connected to the control circuit at a position not shown in the figure.

A field insulating film 39 is formed over the second semiconductor substrate 25. An interlayer film 40 is formed over the second semiconductor substrate 25 with the field insulating film 39 interposed therebetween.

The semiconductor device 24 of the present embodiment is thus different from the conventional semiconductor device (see 124 in FIG. 9) in the following point: the TAP electrode (see 114 in FIG. 9) in the conventional semiconductor device is connected to the drain electrode (see 138 in FIG. 9) of the medium breakdown voltage transistor (see 142 in FIG. 9), while the TAP electrode 14 of the present embodiment is connected to the anode electrode 29 of the reverse current preventing diode 41.

Note that the reverse current preventing diode 41 can be manufactured by a common semiconductor process without increasing the manufacturing cost.

Figure 3:
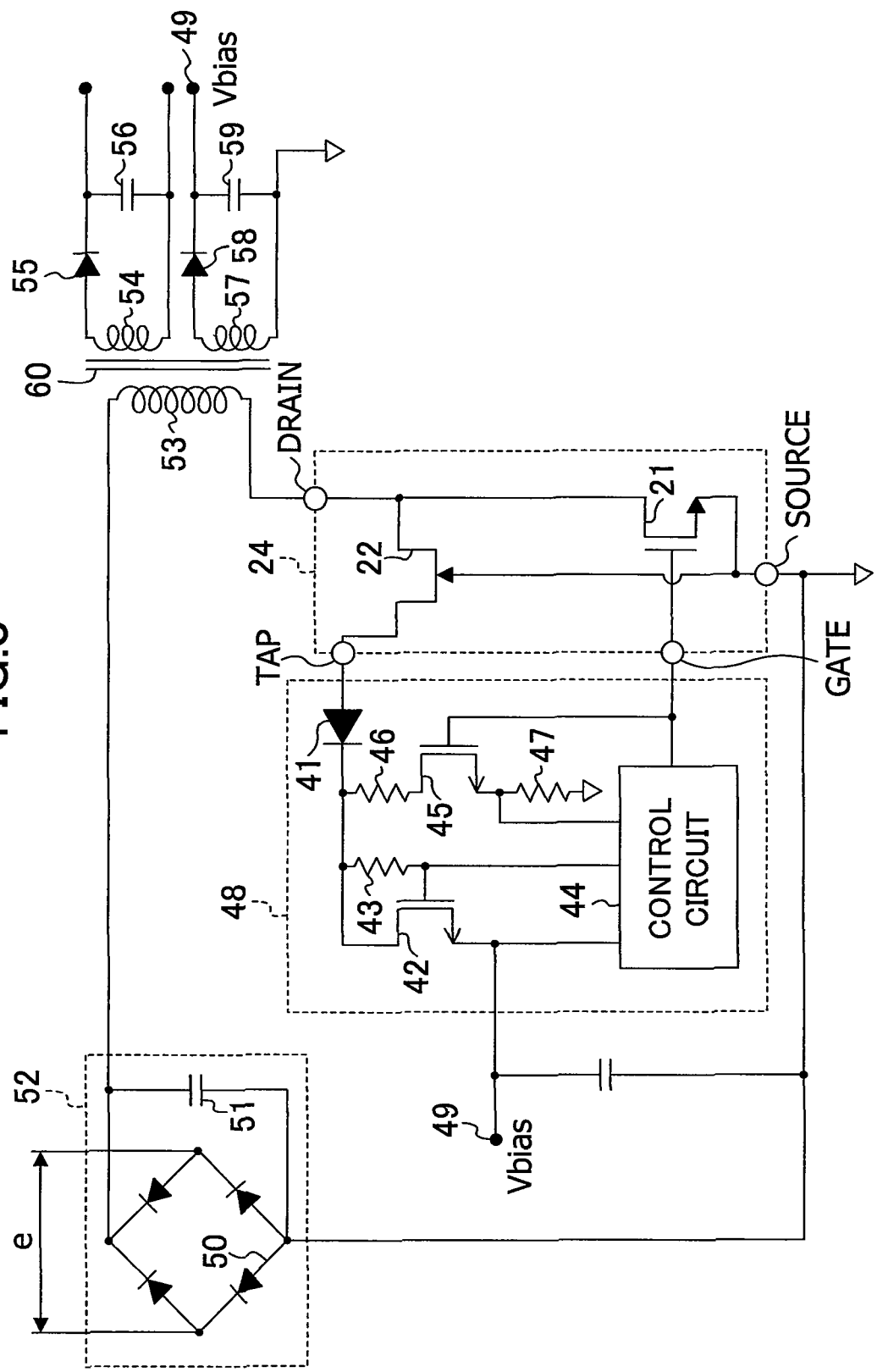
FIG. 3 is a circuit diagram of a switching power supply unit using the semiconductor device of the first embodiment.

Hereinafter, the structure of the switching power supply unit using the semiconductor device 24 of the first embodiment of the present invention will be described with reference to FIG. 3. FIG. 3 is a circuit diagram of the switching power supply unit according to the first embodiment of the present invention. Note that, for simplification of illustration, a first transistor 45 included in the semiconductor integrated circuit 48 is not shown in FIG. 2.

[Switching Power Supply Unit]

As shown in FIG. 3, the switching power supply unit of the present embodiment includes the semiconductor device 24 of the present embodiment, the semiconductor integrated circuit 48, a DC voltage source 52, and a transformer 60. The semiconductor integrated circuit 48 includes the reverse current preventing diode 41 including a reverse current preventing layer (see 26 in FIG. 1) and a well layer (see 27 in FIG. 1), and the control circuit 44 for controlling switching of the semiconductor device 24 for repeatedly conducting and blocking a main current (for switching a main current between a flowing state and a non-flowing state). The transformer 60 includes a primary winding 53, a first secondary winding 54, and a second secondary winding 57. The primary winding 53 is connected in series with the semiconductor device 24 and the DC voltage source 52. The first secondary winding 54 is connected to a load, and the second secondary winding 57 is connected to the control circuit 44. The switching power supply unit is structured so that electric power is supplied from the first secondary winding 54 of the transformer 60 to the load, and so that electric power is supplied from the second secondary winding 57 of the transformer 60 to the control circuit 44. The TAP electrode 14 of the semiconductor device 24 is electrically connected to the reverse current preventing layer of the reverse current preventing diode 41 included in the semiconductor integrated circuit 48.

Each component of the switching power supply unit of the present embodiment will be described below.

[Semiconductor Device]

As shown in FIG. 3, the semiconductor device 24 of the present embodiment includes the switching element 21 and the JFET element 22. The TAP electrode 14 of the JFET element 22 is electrically connected to the reverse current preventing layer (see 26 in FIG. 1) of the reverse current preventing diode 41.

[Semiconductor Integrated Circuit]

The semiconductor integrated circuit 48 includes the reverse current preventing diode 41 including the reverse current preventing layer (see 26 in FIG. 1) and the well layer (see 27 in FIG. 1), and the control circuit 44 for controlling switching of the semiconductor device 24 for switching a main current between a flowing state and a non-flowing state.

The semiconductor integrated circuit 48 further includes the N-type first transistor 45 having a breakdown voltage of, for example, 100 V. The first transistor 45 is connected to the TAP electrode 14 through a first resistor 46 and the reverse current preventing diode 41. The first transistor 45 is connected to a GND potential (ground potential) through a second resistor 47. The gate potential of the first transistor 45 is synchronized with that of the switching element 21.

The semiconductor integrated circuit 48 includes the N-type second transistor 42 having a breakdown voltage of, for example, 100 V. The TAP electrode 14 and the control circuit 44 are connected to each other through the resistor 43 and the second transistor 42. The second transistor 42 is controlled by the control circuit 44 so as to be turned on when the voltage of a Vbias power supply terminal 49 has a predetermined value or less.

[DC Voltage Source]

The DC voltage source 52 is formed by a diode bridge 50 and a filter capacitor 51. An AC power source e is supplied to the DC voltage source 52.

[Transformer]

The transformer 60 includes the primary winding 53, the first secondary winding 54, and the second secondary winding 57. The first secondary winding 54 of the transformer 60 is connected to a diode 55 and a filter capacitor 56. The second secondary winding 57 of the transformer 60 is connected to a diode 58 and a filter capacitor 59.

Figure 8:
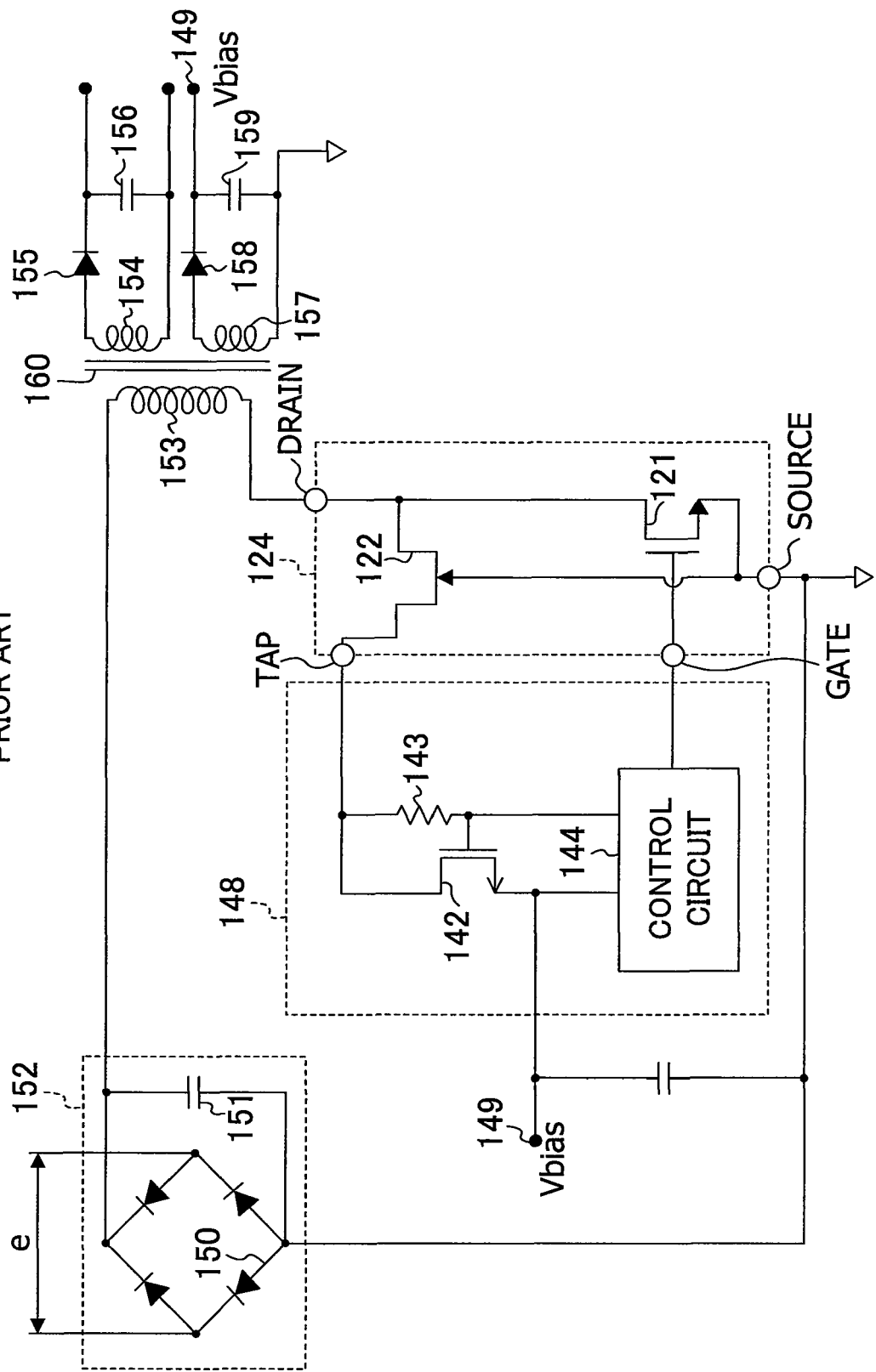
FIG. 8 is a circuit diagram of a switching power supply unit using a conventional semiconductor device.

The switching power supply unit of the present embodiment is different from the conventional switching power supply unit (see FIG. 8) in that the semiconductor integrated circuit 48 includes the reverse current preventing diode 41, and the TAP electrode 14 of the semiconductor device 24 is electrically connected to the reverse current preventing diode 41.

The switching power supply unit of the present embodiment provides the following unique effects:

As described before, latch-up in the semiconductor integrated circuit 48 can be prevented even if the drain electrode 13 is negatively biased with respect to the source electrode 11. Accordingly, a switching power supply unit having higher noise immunity and higher lightning surge immunity than those of the conventional switching power supply unit can be implemented. Moreover, it is not necessary to design a transformer so that the drain electrode 13 is not negatively biased. As a result, design of peripheral parts can be simplified.

The switching power supply unit of the present embodiment provides the following effects:

As shown in FIG. 3, the first transistor 45 has its drain electrode connected to the cathode potential of the reverse current preventing diode 41 through the first resistor 46, and has its source electrode connected to the GND potential through the second resistor 47. The gate potential of the first transistor 45 is synchronized with that of the switching element 21. The first transistor 45 is thus turned at the same time as the switching element 21.

By voltage division by the first resistor 46 and the second resistor 47, the control circuit 44 can detect an on-state voltage which is output to the TAP electrode 14 upon turn-on of the switching element 21 (i.e., an on-state voltage which is output to the drain electrode 13). A current flowing in the semiconductor device 24 can be adjusted by detecting the on-state voltage which is output to the TAP electrode 14.

As in the conventional example, driving electric power can be supplied from the TAP electrode 14 to the control circuit 44 upon starting. Since a low starting voltage which is required upon power-on can be generated by the TAP electrode 14, it is not necessary to provide a high breakdown voltage, high power resistor to supply electric power. As a result, interconnection is simplified, and reduction in cost and reduction in size of a power supply circuit can be achieved accordingly.

Moreover, in the case where the on-state resistance of the switching element 21 has a positive correlation with the temperature, the drain voltage increases at a predetermined rate with increase in temperature at a constant drain current. In this case, when the on-state voltage reaches a predetermined value or higher, it is determined that the semiconductor device 24 is in an overheated state (abnormal state), and the semiconductor device 24 can be protected.

Although not particularly shown in the figure, the timing when the switching element 21 is turned on can be detected in the control circuit 44 by using a voltage resulting from resistance-dividing the cathode potential of the reverse current preventing diode 41.

Note that, in the present embodiment, the switching power supply unit is used as a specific example of the energy transmission device. However, the present invention is not limited to this, and an AC inverter device or the like may be used as the energy transmission device.

In the present embodiment, as shown in FIG. 1, the high breakdown voltage semiconductor element 23 having both the first top semiconductor layer 9a and the second top semiconductor layer 9b is described as a specific example. However, the present invention is not limited to this, and a high breakdown voltage semiconductor element including only the first top semiconductor layer 9a may be used.

Second Embodiment

Figure 4:
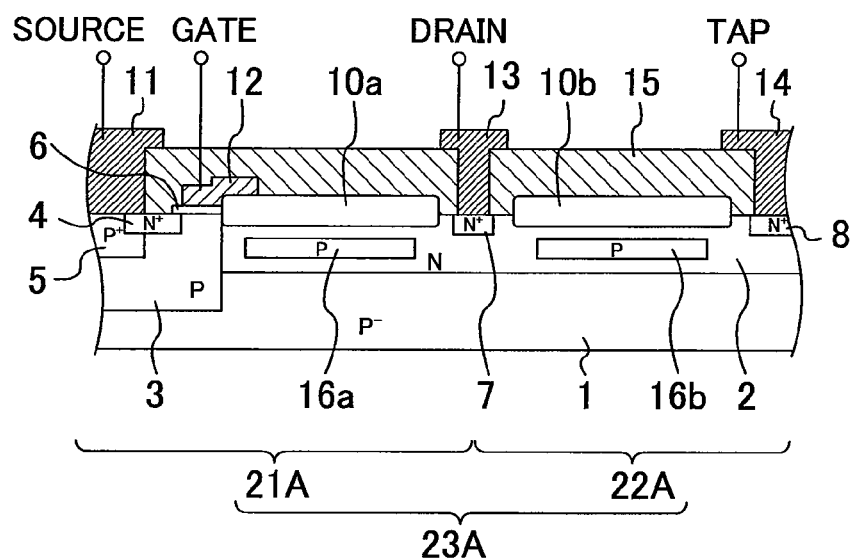
FIG. 4 is a cross-sectional view showing a structure of a switching element and a JFET element of a semiconductor device according to a second embodiment of the present invention.

Hereinafter, a structure of a semiconductor device according to a second embodiment of the present invention will be described with reference to FIG. 4. FIG. 4 is a cross-sectional view showing a structure of a high breakdown voltage semiconductor element 23A in the semiconductor device of the second embodiment. Note that, in FIG. 4, the same components as those of the first embodiment are denoted with the same reference numerals and characters as those of FIG. 1.

The differences from the first embodiment will be mainly described in the second embodiment, and description of the common structure will be omitted as appropriate.

The second embodiment is different from the first embodiment in that the P-type first and second top semiconductor layers 9a, 9b of the first embodiment are replaced with P-type first and second inner semiconductor layers 16a, 16b.

More specifically, in the first embodiment, the first top semiconductor layer 9a is formed spaced apart from the first drain region 7 at the surface of the drift region 2 between the base region 3 and the first drain region 7, as shown in FIG. 1. The second top semiconductor layer 9b is formed spaced apart from the first and second drain regions 7, 8 at the surface of the drift region 2 between the first drain region 7 and the second drain region 8.

In the second embodiment, on the other hand, as shown in FIG. 4, the first inner semiconductor layer 16a is formed spaced apart from the first drain region 7 in the drift region 2 between the base region 3 and the first drain region 7. The second inner semiconductor layer 16b is formed spaced apart from the first and second drain regions 7, 8 in the drift region 2 between the first drain region 7 and the second drain region 8.

In the second embodiment, the first and second top semiconductor layers 9a, 9b are replaced with the first and second inner semiconductor layers 16a, 16b. Accordingly, the concentration in the drift region 2 of the second embodiment can be made higher than that in the drift region 2 of the first embodiment, when the breakdown voltage of a high breakdown voltage semiconductor element 23A of the second embodiment is about the same as that of the high breakdown voltage semiconductor element 23 of the first embodiment. As a result, the on-state resistance of the semiconductor device can be reduced.

Moreover, the drift region 2 under the second top semiconductor layer 9b is mainly depleted in the first embodiment, while the drift region 2 around the second inner semiconductor layer 16b is mainly depleted in the second embodiment. A larger part of the drift region 2 is thus depleted as compared to the first embodiment, whereby the voltage which is output to the TAP electrode 14 can be more easily pinched off.

Note that the high breakdown voltage semiconductor element 23A of the second embodiment can be manufactured by a common semiconductor process without increasing the manufacturing cost, as compared to the high breakdown voltage semiconductor element 23 of the first embodiment.

In the second embodiment, the high breakdown voltage semiconductor element 23A including both the first inner semiconductor layer 16a and the second inner semiconductor layer 16b as shown in FIG. 4 is described as a specific example. However, the present invention is not limited to this, and a high breakdown voltage semiconductor element including, for example, only the first inner semiconductor layer 16a may be used.

Third Embodiment

Figure 5:
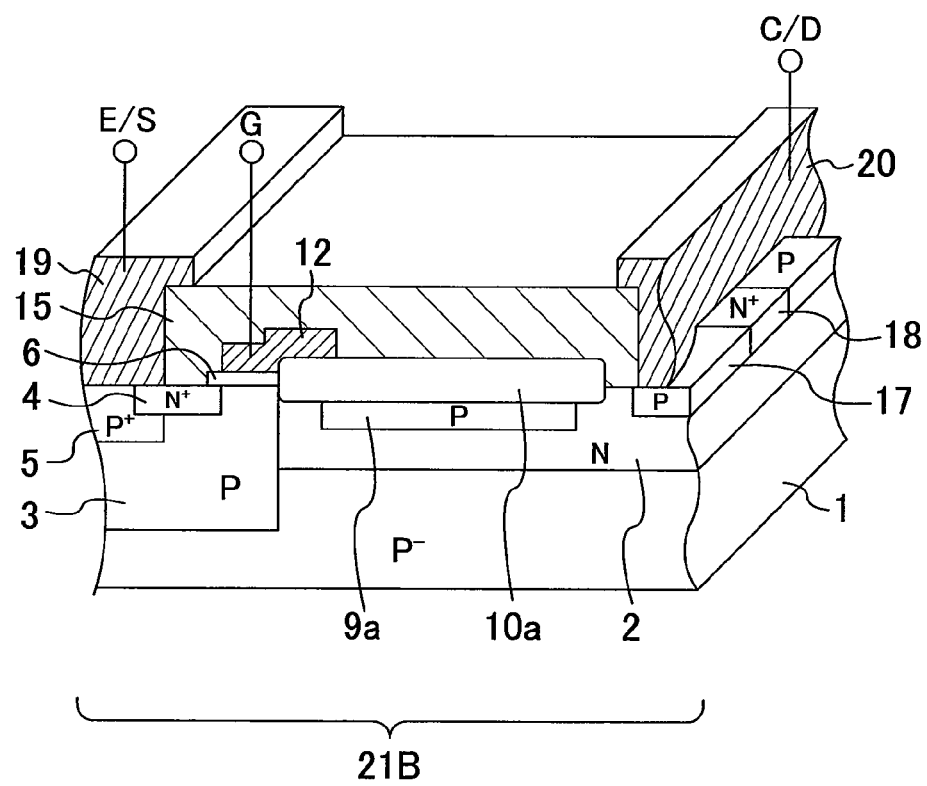
FIG. 5 is a perspective view showing a structure of a switching element portion of a semiconductor device according to a third embodiment of the present invention.
Figure 6:
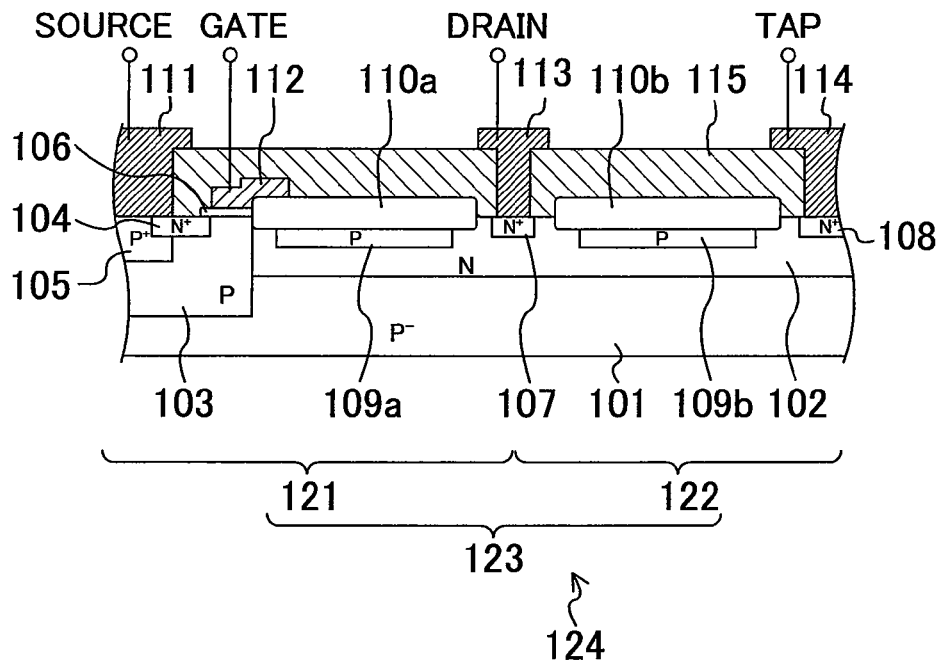
FIG. 6 is a cross-sectional view showing a structure of a conventional semiconductor device.
Figure 7:
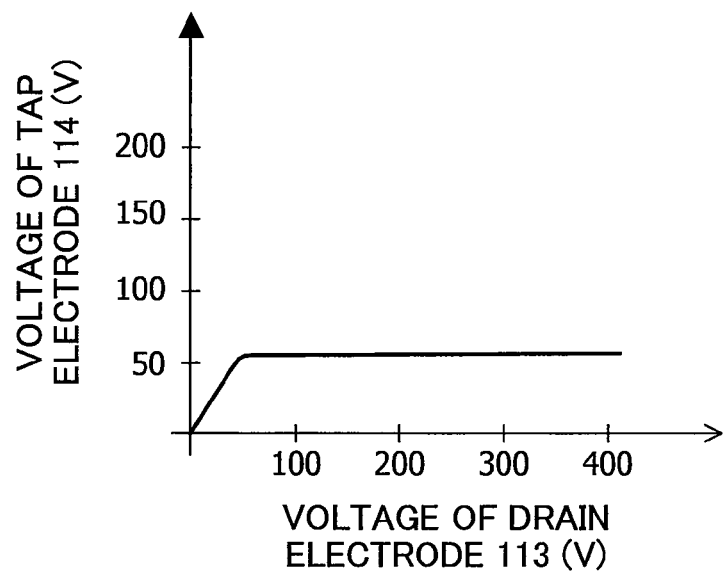
FIG. 7 is a graph showing pinch-off characteristics of a TAP electrode.

Hereinafter, a structure of a semiconductor device according to a third embodiment of the present invention will be described with reference to FIG. 5. FIG. 5 is a perspective view of a switching element 21B in the semiconductor device of the third embodiment. Note that, in FIG. 5, the same components as those of the first embodiment are denoted with the same reference numerals and characters as those of FIG. 1. The differences from the first embodiment will be mainly described in the third embodiment, and description of the common structure will be omitted as appropriate.

The third embodiment is different from the first embodiment in that a collector region (see 17 in FIG. 5) is provided in addition to the first drain region to form an IGBT switching element. The differences between the first embodiment and the third embodiment will now be described in detail.

Firstly, the first drain region 7 is formed at the surface of the drift region 2 in the first embodiment, as shown in FIG. 1, while a P-type collector region 17 and an N$^+$-type first drain region 18 adjacent to the collector region 17 are formed at the surface of the drift region 2 in the third embodiment, as shown in FIG. 5.

Secondly, the source electrode 11 which is electrically connected to the base region 3 and the source region 4 is provided in the first embodiment, while an emitter/source electrode 19 which is electrically connected to the base region 3 and the source region 4 is provided in the third embodiment.

Thirdly, the drain electrode 13 which is electrically connected to the first drain region 7 is provided in the first embodiment, while a collector/drain electrode 20 which is electrically connected to the collector region 17 and the first drain region 18 is provided in the third embodiment.

When a positive bias is applied between the collector/drain electrode 20 and the emitter/source electrode 19 and a positive voltage is applied to the gate electrode 12 in the switching element 21B, a current starts to flow from the first drain region 18 through the source region 4 to the emitter/source electrode 19 (MOSFET operation). When the potential of the drift region 2 under the collector region 17 becomes smaller than that of the collector region 17 by about 0.6 V, holes are injected from the collector region 17 into the drift region 2, whereby the operation switches from MOSFET operation to IGBT operation. The on-state resistance of the semiconductor device can further be reduced.

Moreover, since electrons can be extracted from the first drain region 18 upon turn-off, the switching speed can be increased.

Note that the switching element 21B of the third embodiment can be manufactured by a common semiconductor process without increasing the manufacturing cost, as compared to the switching element 21 of the first embodiment.

The structure having the collector region 17 in addition to the first drain region 18 is described as a specific example in the third embodiment. However, the present invention is not limited to this. For example, only a collector region may be provided instead of the first drain region.

In the first through third embodiments, the structure in which the semiconductor device and the semiconductor integrated circuit are formed on separated semiconductor substrates is described as a specific example. However, the present invention is not limited to this, and the semiconductor device and the semiconductor integrated circuit may be formed on a common semiconductor substrate.

In the first through third embodiments, a lateral semiconductor device in which a current flows in a lateral direction to the semiconductor substrate 1 is described as a specific example. However, the present invention is not limited to this, and the semiconductor device of the present invention may be a vertical semiconductor device in which a current flows in a vertical direction to the semiconductor substrate.

In the first and third embodiments, the semiconductor device including the first and second top semiconductor layers 9a, 9b at the surface of the drift region 2 is described as a specific example. In the second embodiment, the semiconductor device including the first and second inner semiconductor layers 16a, 16b in the drift region 2 is described as a specific example. However, the present invention is not limited to these. The present invention is applicable also to a semiconductor device having neither top semiconductor layer and nor inner semiconductor layer.

Note that, as described above, the present invention can prevent latch-up in a semiconductor integrated circuit even if the first drain electrode is negatively biased with respect to the source electrode. Since the first drain electrode can be negatively biased with respect to the source electrode, the present invention is useful for a semiconductor device and an energy transmission device using the semiconductor device.

What is claimed is:

1. A semiconductor device, comprising:
a high breakdown voltage semiconductor element including a switching element and a JFET element, wherein
the high breakdown voltage semiconductor element includes
a drift region of a first conductivity type formed at a surface of a first semiconductor substrate,
a base region of a second conductivity type formed adjacent to the drift region at the surface of the first semiconductor substrate,
a source region of a first conductivity type formed spaced apart from the drift region at a surface of the base region,
a gate insulating film formed on the base region between the source region and the drift region,
a region formed spaced apart from the base region at a surface of the drift region,
a second drain region of a first conductivity type formed spaced apart from the region at the surface of the drift region,
a source electrode formed over the first semiconductor substrate and electrically connected to the base region and the source region,
a gate electrode formed on the gate insulating film,
an electrode formed over the first semiconductor substrate and electrically connected to the region, and
a second drain electrode formed over the first semiconductor substrate and electrically connected to the second drain region,
the second drain electrode is electrically connected to a reverse current preventing layer of a second conductivity type formed at a surface of a second semiconductor substrate, and
the reverse current preventing layer is covered by a well layer of a first conductivity type formed in the second semiconductor substrate.

2. The semiconductor device of claim 1, wherein
the region is a first drain region of a first conductivity type, and
the electrode is a first drain electrode.

3. The semiconductor device of claim 1, wherein the first semiconductor substrate and the second semiconductor substrate are formed separately.

4. The semiconductor device of claim 1, wherein the first semiconductor substrate and the second semiconductor substrate are formed as a common substrate.

5. The semiconductor device of claim 2, wherein
a conductivity type of the first semiconductor substrate is a second conductivity type, and
the high breakdown voltage semiconductor element further includes
a first top semiconductor layer of a second conductivity type which is formed spaced apart from the first drain region at the surface of the drift region between the base region and the first drain region, and which is electrically connected to the base region.

6. The semiconductor device of claim 2, wherein
a conductivity type of the first semiconductor substrate is a second conductivity type, and
the high breakdown voltage semiconductor element further includes
a first inner semiconductor layer of a second conductivity type which is formed spaced apart from the first drain region in the drift region between the base region and the first drain region, and which is electrically connected to the base region.

7. The semiconductor device of claim 1, wherein
the region is a collector region of a second conductivity type,
the electrode is a collector electrode, and
the collector electrode is electrically connected to the collector region.

8. The semiconductor device of claim 1, wherein
the region includes a collector region of a second conductivity type and a first drain region of a first conductivity type adjacent to the collector region,
the electrode is a collector/drain electrode, and
the collector/drain electrode is electrically connected to the collector region and the first drain region.

9. An energy transmission device, comprising:
the semiconductor device of claim 1;
a semiconductor integrated circuit including a reverse current preventing diode including the reverse current preventing layer and the well layer, and a control circuit for controlling switching of the semiconductor device which repeatedly conducts and blocks a main current;
a DC voltage source; and
a transformer, wherein
the transformer includes
a primary winding connected in series with the semiconductor device and the DC voltage source, and
a first secondary winding connected to a load,
the energy transmission device is configured so that electric power is supplied from the first secondary winding of the transformer to the load, and
the second drain electrode of the semiconductor device is electrically connected to the reverse current preventing layer of the semiconductor integrated circuit.

10. The energy transmission device of claim 9, wherein
the transformer further includes a second secondary winding connected to the control circuit, and
the energy transmission device is configured so that electric power is supplied from the second secondary winding of the transformer to the control circuit.

11. The energy transmission device of claim 9, wherein
the reverse current preventing diode further includes
a cathode contact region of a first conductivity type formed spaced apart from the reverse current preventing layer at a surface of the well layer,
an anode electrode formed over the second semiconductor substrate and electrically connected to the reverse current preventing layer, and
a cathode electrode formed over the second semiconductor substrate and electrically connected to the cathode contact region, and
the anode electrode is connected to the second drain electrode of the semiconductor device.

12. The energy transmission device of claim 9, wherein
the semiconductor integrated circuit further includes a first transistor of a first conductivity type,
the first transistor is connected to the second drain electrode of the semiconductor device through a first resistor and the reverse current preventing diode, the first transistor is connected to a ground potential through a second resistor, and a gate potential of the first transistor is synchronized with a gate potential of the switching element.

13. The energy transmission device of claim 9, wherein the semiconductor integrated circuit further includes a second transistor of a first conductivity type, the second drain electrode of the semiconductor device and the control circuit are connected to each other through a resistor and the second transistor, and the second transistor is controlled by the control circuit so as to be turned on when a voltage of a bias power supply terminal for supplying a current to the control circuit has a predetermined value or less.

* * * * *